April 2, 1968 P. BACHWANSKY 3,376,164

PHOTOVOLTAIC POWER ASSEMBLY

Filed Aug. 1, 1963

PETER BACHWANSKY
INVENTOR.

BY Lyon & Lyon

ATTORNEYS

United States Patent Office 3,376,164
Patented Apr. 2, 1968

3,376,164

PHOTOVOLTAIC POWER ASSEMBLY

Peter Bachwansky, Sierre Madre, Calif., assignor, by mesne assignments, to Globe-Union Inc., Milwaukee, Wis., a corporation of Delaware Filed Aug. 1, 1963, Ser. No. 299,262
8 Claims. (Cl. 136—89)

ABSTRACT OF THE DISCLOSURE

This invention relates to a photovoltaic power assembly and more particularly relates to such an assembly for mounting a plurality of semiconductor elements in electrical series relationship.

Portable radios and other electronic equipment are now being produced which are adapted to be powered by the electrical energy produced by photovoltaic semiconductor devices, commonly known as solar cells. As the voltage output of a single conventional solar cell is not sufficient for this purpose, various schemes have been proposed for mounting a plurality of these cells in series relationship so as to have the benefit of the cumulative voltage output of the cells. In order to obtain maximum voltage output from each individual cell, it is necessary to expose as much of the surface of the cell as possible to the impinging radiation.

It is therefore an object of the present invention to provide a power assembly in which a plurality of solar cells are electrically connected in series.

It is also an object of the present invention to provide such an assembly in which the entire radiation responsive surface of each cell is exposed to the impinging radiation.

It is another object of the present invention to provide such an assembly which is flexible and more durable than those heretofore provided.

These and other objects and advantages of the present invention will become more apparent upon reference to the accompanying description and drawings in which.

Figure 1:
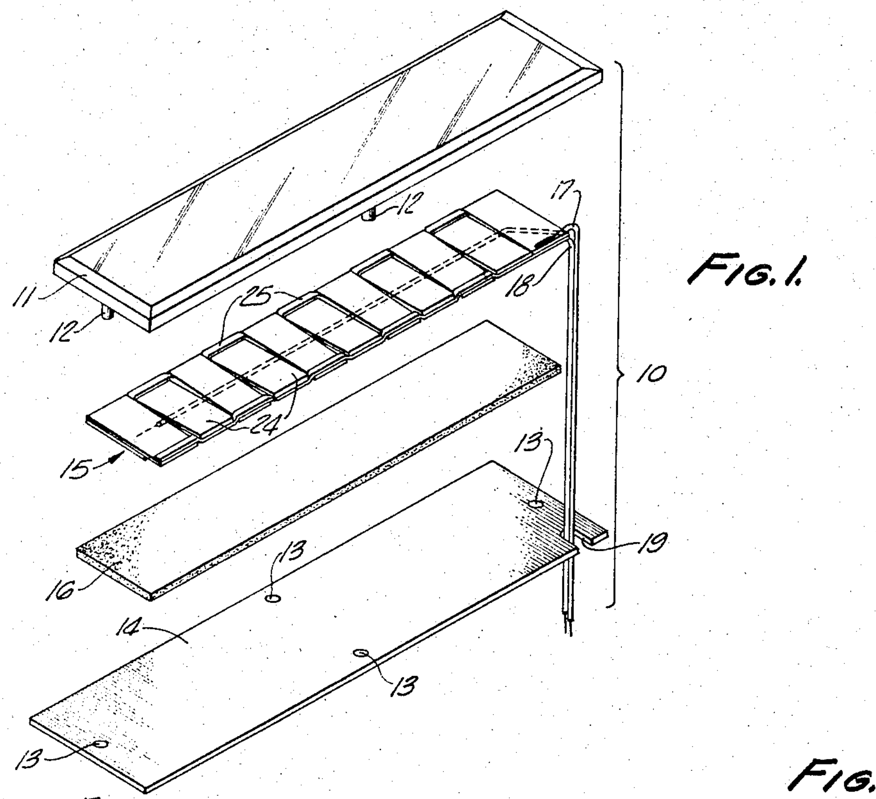
FIGURE 1 is an exploded perspective view of the power assembly of the present invention.

Referring now to the several figures, and particularly FIGURE 1, there is shown a power unit generally indicated at 10 having a case 11 with pins 12 that cooperate with holes 13 in a bottom cover 14 to form a complete housing or enclosure. The case 11 is provided with a recess for receiving a circuit board and solar cell assembly, generally indicated at 15, and a shock absorbing pad 16 of any suitable material. The circuit board and solar cell assembly 15 has positive and negative leads 17 and 18 respectively which pass out of the enclosure through a slot 19 formed in the bottom cover 14.

Figure 2:
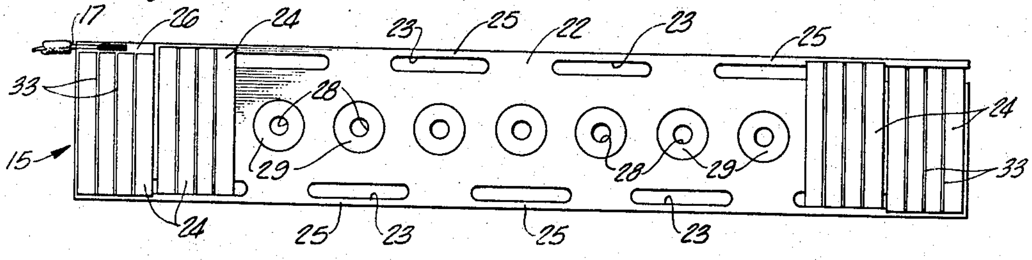
FIGURE 2 is a top plan view of a partially constructed circuit board and solar cell assembly of the present invention.
Figure 3:
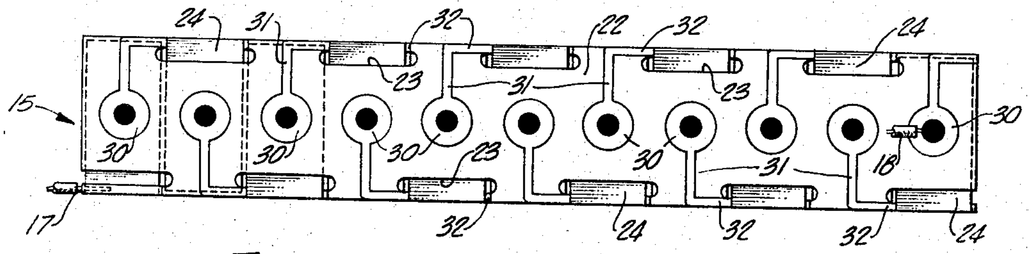
FIGURE 3 is a bottom plan view of a completed circuit board and solar cell assembly according to the present invention.

FIGURES 2 and 3 show the details of the circuit board and solar cell assembly 15. A flexible circuit board 22 of any suitable material such as an epoxy resin is provided with a plurality of longitudinal slots 23 adjacent the two longitudinal edges thereof and spaced inwardly therefrom, the slots adjacent each edge being staggered with relation to the slots adjacent the other edge. Each of the slots 23 is long enough to receive the end of a conventional solar cell 24 and spaced adjacent the edge of the board 22 so that a bridging strip 25 of material is left which is as wide or wider than the bonding or ohmic contact strip 26 of the cells 24.

Each of the cells 24 is fabricated by conventional techniques so as to have a P–N junction immediately below the light receiving surface and a nickel plating on the undersurface thereof and on the ohmic contact strip 26. The cells 24 are also preferably solder dipped so that a layer of solder overlays the nickel plating.

The board 22 is further provided with a plurality of centrally located holes 28, each of the holes being spaced laterally inward from one of the slots 23. The holes 28 are plated with copper, forming a conductive layer 29 on the upper surface of the board, the plating extending through to the other side of the board to form a conductive layer 30 on the undersurface of the board as shown in FIGURE 3. A copper strip 31 runs from the plating layer 30 to the edge of the board and then continues along the underside of the board to form a copper strip 32 underneath each of the bridging strips 25. The copper 29, 30, 31 and 32 is then preferably tin plated in the conventional manner.

The cells 24 are now partially inserted or woven into the slots 23 in the board 22 with the bonding strip 26 of each cell being positioned in engagement with the copper strip 32 underlying each bridging strip 25 of the board. The assembly is now heated in a suitable furnace with the result that the solder plated on the undersurfaces and bonding strips of the cells melts and bonds the undersurface of the cells to the tin plating overlying the copper plating 29 around the holes 28, and the bonding strip 26 of the cells to the tin plated copper strips 32. This operation, of course, could be done by hand-soldering if desired. The negative lead 18 is then soldered to the tin plating overlying the copper plating 30 surrounding the hole 28 at the extreme righthand end of the board, and the positive lead 17 is soldered to the bonding strip 26 of the solar cell 24 at the extreme lefthand end of the board. This last cell is not woven into a slot but lies in its entirety on the surface of the board.

All of the cells 24 are now connected in a series circuit. Starting from the positive lead 17, this circuit may be traced through the bonding strip 26 and grid lines 33 of the first or lefthandmost solar cell to the P-layer of the cell, through the P–N junction to the N-layer of the cell and thence to the plated hole 28, through the plated hole 28 to the copper strip 31, and through the copper strip 32 to the contact layer 26 of the next cell 24. The circuit is continued in this manner until the last cell is reached, the N-layer of this cell being connected through its plated hole 28 to the negative lead 18.

From the foregoing description it can be seen that a compact, relatively rugged, power assembly has been provided which utilizes a plurality of solar cells connected in series. The entire radiation receptive surface of each of the cells is completely exposed so that the cells produce their maximum possible output. No interconnecting wires are necessary for joining the various cells, all the necessary connections being formed on a flexible printed circuit board.

The invention may be embodied in other specific forms not departing from the spirit or central characteristics thereof. The present embodiment is therefore to be considered in all respects as illustrative and not restrictive, the scope of the invention being indicated by the appended claims rather than by the foregoing description, and all changes which come within the meaning and range of equivalency of the claims are therefore intended to be embraced therein.

I claim:

1. A photovoltaic power assembly comprising a plurality of photovoltaic semiconductor devices, each of said devices having a bonding strip along one end thereof; a circuit board for mounting said semiconductor devices, said circuit board having a plurality of longitudinal slots formed therein adjacent the edges thereof, each of said semiconductor devices being partially inserted through one of said slots with its bonding strip engaging the underside of the board; and electrically conductive material positioned on said circuit board for electrically connecting said plurality of semiconductor devices.

2. A photovoltaic power assembly comprising a plurality of photovoltaic semiconductor devices, each of said devices having a bonding strip along one end thereof; and a circuit board for mounting said semiconductor devices, circuit board having a plurality of longitudinal slots formed therein adjacent the edges thereof and spaced inwardly therefrom, each of said semiconductor devices being partially inserted through one of said slots with its bonding strip engaging the underside of the board, each alternate semiconductor device having its bonding strip facing in the opposite direction from the bonding strips of the remaining semiconductor devices; and electrically conductive material positioned on said circuit board for electrically connecting said plurality of semiconductor devices.

3. A photovoltaic power assembly comprising a plurality of photovoltaic semiconductor devices, each of said devices having a bonding strip along one end thereof; a circuit board for mounting said semiconductor devices, said circuit board having a plurality of longitudinal slots formed therein adjacent the longitudinal edges thereof and spaced inwardly therefrom to leave bridging strips of material, the slots adjacent each edge being staggered with respect to the slots adjacent the other edge; a strip of conductive material mounted on the underside of each bridging strip; each of said semiconductor devices being partially inserted through one of said slots with its bonding strip engaging one of said strips of conductive material; and additional electrically conductive material positioned on said circuit board for electrically connecting each of said conductive strips with an adjacent semiconductor device.

4. A photovoltaic power cell assembly comprising a circuit board having a plurality of longitudinal slots formed therein adjacent the longitudinal edges thereof and spaced inwardly therefrom to leave bridging strips of material, the slots adjacent each edge being staggered with respect to the slots adjacent the other edge; a strip of conductive material mounted on the underside of each bridging strip; a plurality of conductive means, each of said conductive means electrically connecting one of said conductive strips with the upper surface of said board in an area laterally spaced from the next succeeding slot; and a plurality of photovoltaic semiconductor devices positioned on said board, each of said semiconductor devices having a bonding strip along one end thereof, each of said semiconductor devices being partially inserted through one of said slots with its bonding strip engaging one of said strips of conductive material and its undersurface engaging one of said conductive means.

5. A photovoltaic power assembly comprising a circuit board having a plurality of longitudinal slots formed therein adjacent the longitudinal edges thereof and spaced inwardly therefrom to leave bridging strips of material, the slots adjacent each edge being staggered with respect to the slots adjacent the other edge, and a plurality of holes formed therein, each of said holes being laterally spaced from one of said slots; a strip of conductive material mounted on the underside of each bridging strip; a mass of conductive material positioned in each of said holes and forming a conductive layer on each surface of said board adjacent said hole; a plurality of conductive strips mounted on the underside of said board, each of said conductive strips electrically connecting one of said strips of conductive material with the mass of conductive material positioned in the hole laterally spaced from the next succeeding slot; and a plurality of photovoltaic semiconductor devices positioned on said board, each of said semiconductor devices having a bonding strip along one end thereof and a contact layer on the undersurface thereof, each of said semiconductor devices being partially inserted through one of said slots with its bonding strip engaging one of said strips of conductive material and its contact layer engaging the mass of conductive material positioned in the hole spaced inwardly from the slot.

6. The assembly of claim 5 wherein a further photovoltaic semiconductor device is positioned completely on the upper surface of said board with its contact layer engaging the mass of conductive material positioned in the first hole in said board, and its bonding strip being electrically connected to a first external electrical conductor, and wherein a second external electrical conductor is electrically connected to the mass of conductive material positioned in the last hole on said board.

7. The assembly of claim 6 wherein said board and semiconductor devices mounted thereon are positioned in a case having an upper surface formed of light transmissive material, said semiconductor devices having their upper surfaces positioned below said upper surface, said case having an opening therein for passage of said first and second external conductors.

8. A mount for photovoltaic semiconductor devices, comprising a circuit board having a plurality of longitudinal slots formed therein adjacent the longitudinal edges thereof and spaced inwardly therefrom to leave bridging strips of material, the slots adjacent each edge being staggered with respect to the slots adjacent the other edge, and a plurality of holes formed therein, each of said holes being laterally spaced from one of said slots; a strip of conductive material mounted on the underside of each bridging strip; a mass of conductive material positioned in each of said holes and forming a conductive layer on each surface of said board adjacent said hole; a plurality of conductive strips mounted on the underside of said board, each of said conductive strips electrically connecting one of said strips of conductive material with the mass of conductive material positioned in the hole laterally spaced from the next succeeding slot.

References Cited

UNITED STATES PATENTS

| | | | |
|---|---|---|---|
| 2,902,628 | 9/1959 | Leno | 29—155.5 |
| 2,961,584 | 11/1960 | Banik | 174—68.5 |
| 3,232,795 | 2/1966 | Gillette et al. | 136—89 |

ALLEN B. CURTIS, *Primary Examiner.*